(12) United States Patent
Gumpher

(10) Patent No.: US 7,498,270 B2
(45) Date of Patent: Mar. 3, 2009

(54) METHOD OF FORMING A SILICON OXYNITRIDE FILM WITH TENSILE STRESS

(75) Inventor: John Gumpher, McKinney, TX (US)

(73) Assignee: Tokyo Electron Limited, Tokyo (JP)

( * ) Notice: Subject to any disclaimer, the term of this patent is extended or adjusted under 35 U.S.C. 154(b) by 462 days.

(21) Appl. No.: 11/239,318

(22) Filed: Sep. 30, 2005

(65) Prior Publication Data

US 2007/0077777 A1    Apr. 5, 2007

(51) Int. Cl.
*H01L 21/469* (2006.01)
(52) U.S. Cl. .............. 438/770; 257/E21.267; 438/786
(58) Field of Classification Search ........ 438/770, 438/786; 257/E21.267
See application file for complete search history.

(56) References Cited

U.S. PATENT DOCUMENTS

| | | | | |
|---|---|---|---|---|
| 5,514,908 A | * | 5/1996 | Liao et al. | 257/751 |
| 5,652,464 A | * | 7/1997 | Liao et al. | 257/751 |
| 6,673,659 B2 | * | 1/2004 | Sakama et al. | 438/149 |
| 6,803,289 B1 | * | 10/2004 | Gopalan et al. | 438/343 |
| 7,238,604 B2 | * | 7/2007 | Kloster et al. | 438/619 |
| 2005/0255714 A1 | * | 11/2005 | Iyer et al. | 438/793 |

OTHER PUBLICATIONS

P. Temple-Boyer, C. Rossi, E. Saint-Etienne, and E. Scheid. (1998). "Residual Stress in Low Pressure Chemical Vapor Deposition SiNx Films Deposited from Silane and Ammonia" J. Vac. Sci. Technol. A, 16(4): 2003-2007.

* cited by examiner

*Primary Examiner*—Asok K Sarkar
(74) *Attorney, Agent, or Firm*—Oblon, Spivak, McClelland, Maier & Neustadt, P.C.

(57) ABSTRACT

A method for forming a densified silicon oxynitride film with tensile stress and a semiconductor device including the densified silicon oxynitride film. The densified silicon oxynitride film can be formed by depositing a porous SiNC:H film on a substrate in a LPCVD process, and exposing the porous SiNC:H film to an oxygen-containing gas to incorporate oxygen into the SiNC:H film, thereby forming a densified SiONC:H film having a greater density than the porous SiNC:H film. The densified silicon oxynitride film can be included on a substrate including the semiconductor device.

19 Claims, 6 Drawing Sheets

METHOD OF FORMING A SILICON OXYNITRIDE FILM WITH TENSILE STRESS

FIELD OF THE INVENTION

The present invention relates to semiconductor processing, and more particularly to a method of forming a silicon oxynitride film with high tensile stress in the film and a semiconductor device containing the highly tensile stressed silicon oxynitride film.

DISCUSSION OF THE RELATED ART

Silicon nitride and silicon nitride based films are widely used in semiconductor devices and ultra-large-scale integrated circuits. For example, silicon nitride films have been widely used in semiconductor devices as a diffusion barrier for dopants, as an etch-stop film during etching of fine features, as a final passivation film for encapsulation of fabricated devices, among many other uses.

Silicon nitride films can be deposited at low pressure or at atmospheric pressure using a variety of processing systems and process gases. These processing systems can perform, for example, thermal chemical vapor deposition (TCVD), plasma-enhanced chemical vapor deposition (PECVD), or remote-PECVD. In remote-PECVD, the substrate to be processed is not placed in direct contact with the plasma but rather is placed down-stream of the plasma discharge. Device quality silicon nitride films have been deposited, for example, by PECVD using silane ($SiH_4$) and ammonia ($NH_3$) or nitrogen ($N_2$) or by thermal CVD using dichlorosilane ($SiH_2Cl_2$) and $NH_3$. Deposited silicon nitride films are often under compressive or tensile stress. The stress of silicon nitride films has been observed to vary from about 1.3 GPa (1 GPa=$1 \times 10^9$ Pascal) tensile for dense low-pressure CVD (LPCVD) films to compressive for PECVD and low-temperature films with high impurity concentrations.

Recent innovations to improve complementary metal oxide semiconductor (CMOS) transistor performance have created an industry need for stressed ceramic layers compatible with current ultra-large scale integration (ULSI) integration techniques. In particular, channel carrier mobility for a negative metal oxide semiconductor (NMOS) transistors can be increased through introduction of tensile uniaxial or biaxial strain on a channel region of a MOS transistor. Typically, this has been accomplished by deposition of highly tensile stressed silicon nitride as a cap layer over the source/drain regions. Tensile level stress levels of greater than or equal to about 1.5 GPa are required to achieve the desired strain. The tensile stress of as-deposited silicon nitride films can be further increased by exposure to ultra-violet (UV) light, but this approach requires additional UV hardware in order to process these films. While other novel materials may be explored for this application, silicon nitride and silicon nitride based materials are preferable due to their compatibility with existing fabrication processes.

SUMMARY OF THE INVENTION

In one embodiment of the present invention, a method is described for forming a silicon oxynitride (SiONC:H) film with high tensile stress. The resultant silicon oxynitride films of the present invention may be planar or non-planar, such as for example a silicon oxynitride film formed over a MOS gate of a semiconductor device.

Accordingly, one method of the present invention includes depositing a porous SiNC:H film on a substrate, and exposing the porous SiNC:H film to an oxygen-containing gas to incorporate oxygen into the deposited SiNC:H film to thereby form a densified SiONC:H film having a density greater than the porous SiNC:H film. In one embodiment of the present invention, the tensile stress of the densified SiONC:H film is equal to or greater than about 1.5 GPa.

According to one embodiment of the present invention, the porous SiNC:H film can be deposited from a process gas including bis(tertiary-butylaminosilane) (BTBAS) and ammonia ($NH_3$), and the exposure of the porous SiNC:H film to the oxygen-containing gas can be performed while maintaining the substrate at a temperature between about 500° C. and about 800° C., for example 550° C.

According to another embodiment of the present invention, the densified SiONC:H film can be formed on a substrate including a semiconductor device, thereby forming a semiconductor device including the densified SiONC:H film. The densified SiONC:H film can have a tensile stress equal to or greater than about 1.5 GPa. The substrate including the densified SiONC:H film can further include at least one doped region and a gate stack formed on the substrate.

It is to be understood that both the foregoing general description of the invention and the following detailed description are exemplary, but are not restrictive of the present invention

BRIEF DESCRIPTION OF THE DRAWINGS

A more complete appreciation of the present invention and many attendant advantages thereof will be readily obtained as the same becomes better understood by reference to the following detailed description when considered in connection with the accompanying drawings, wherein.

DETAILED DESCRIPTION OF THE PREFERRED EMBODIMENTS

In the following description, in order to facilitate a thorough understanding of the invention and for purposes of explanation and not limitation, specific details are set forth, such as a particular structure of a semiconductor device and geometry of a batch processing system and descriptions of various components. However, it should be understood that the invention may be practiced in other embodiments that depart from these specific details.

As used herein, silicon nitride films are referred to as SiNC:H films to illustrate that these films can include silicon (Si), nitrogen (N), carbon (C), and hydrogen (H). According to an embodiment of the present invention, the SiNC:H films can be deposited from an organosilane precursor and a nitrogen-containing gas, but other silicon-containing precursors may be utilized. For example, a SiNC:H film can be deposited from a process gas containing for example bis(tertiary-butylaminosilane) (BTBAS, SiH$_2$(NHBu$^t$)$_2$) and ammonia (NH$_3$) Analogously, silicon oxynitride films are herein referred to as SiONC:H films. The elemental composition of both the SiNC:H and SiONC:H films can vary over wide ranges of atomic concentrations for the Si, N, C, O, and H elements. The notations SiNC:H and SiONC:H indicate that H is present for example as an impurity in the layers. The H impurity content can be for example equal to or greater than about 10 atomic percent, but other H atomic percentages are contemplated by the present invention such as for example 10-25 atomic percent hydrogen. The silicon nitro-carbon films and the silicon oxy-nitro-carbon films of the present invention may also be films having only trace amounts of hydrogen.

Figure 1:
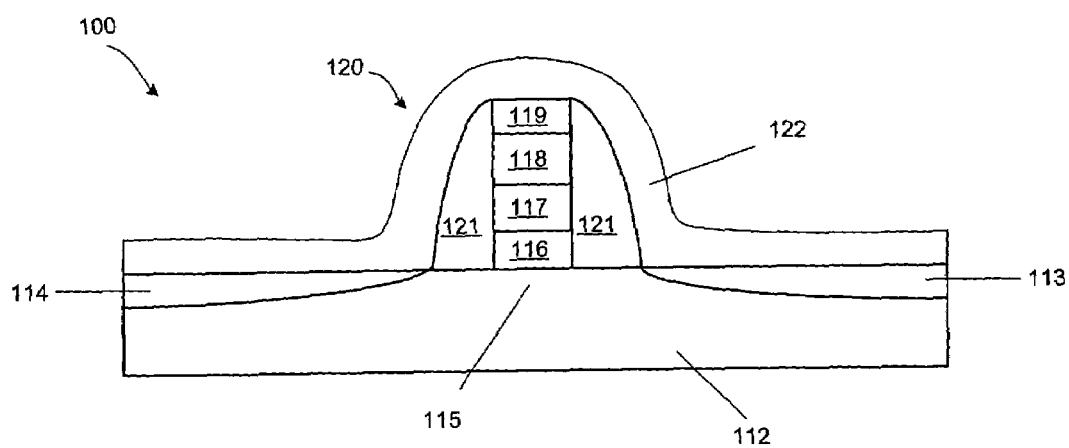
FIG. 1 is a schematic showing a cross-sectional view of a MOS device according to an embodiment of the present invention including a silicon oxynitride film with tensile stress.

Referring now to the drawings, wherein like reference numerals designate identical, or corresponding parts throughout the several views, and more particularly to FIG. 1, FIG. 1 schematically shows a cross-sectional view of one embodiment of the present invention in which a densified SiONC:H film 122 is disposed on a MOS device 100. The device 100, as shown, includes besides the densified SiONC:H film 122 a substrate 112 having doped regions 113 and 114 (e.g., source and drain), a gate stack 120, and a spacer 121. The substrate 112 can for example be a Si, Ge, Si/Ge, or GaAs substrate wafer. The substrate 112 can be of any size, for example, a 200 mm substrate, a 300 mm substrate, or an even larger substrate.

The gate stack 120 includes a dielectric layer 116 on the channel region 115. The dielectric layer 116 can for example include a silicon dioxide layer (e.g., SiO$_2$), a silicon nitride layer, a silicon oxynitride layer, or a combination thereof, or any other appropriate material. The dielectric layer 116 can further include a high-dielectric constant (high-k) dielectric material. The high-k dielectric material can for example include metal oxides and their silicates, including Ta$_2$O$_5$, TiO$_2$, ZrO$_2$, Al$_2$O$_3$, Y$_2$O$_3$, HfSiO$_x$, HfO$_2$, ZrO$_2$, ZrSiOx, TaSiO$_x$, SrO$_x$, SrSiO$_x$, LaO$_x$, LaSiO$_x$, YO$_x$, or YSiO$_x$, or combinations of two or more thereof.

In one embodiment of the present invention, a conductive layer 117 (e.g., a gate electrode layer) is formed on the dielectric layer 116, and a silicide layer 118 is formed on the conductive layer 117 to reduce the electrical resistance of the conductive layer 116. The cap layer 119 can be positioned on top of the gate stack 120 to protect the gate stack 120. The cap layer 119 can, for example, be a silicon nitride (e.g. Si$_3$N$_4$, SiNC:H) or silicon oxynitride (e.g. SiON, SiONC:H) layer.

In one embodiment of the present invention, the conductive layer 117 can be doped polycrystalline silicon (poly-Si), and the silicide layer 118 can be tungsten silicide. According to the present invention, the gate stack 120 may include different and fewer or more layers than shown in FIG. 1. In one example, layer 117 and/or 118 may be replaced by a metal gate layer. FIG. 1 further shows that spacer 121 is formed on either side of the gate stack 120 in order to protect the gate stack 120 from damage and ensure electrical performance of the gate. In addition, the spacer 121 can be used as a hard mask for the formation of the source and drain 113, 114 of the MOS device 100. Alternately, in one embodiment of the present invention, more than one spacer 121 may be used.

In one embodiment of the present invention, the device 100 can be a NMOS device where a densified SiONC:H film 122 increases channel carrier mobility through introduction of a tensile stress on the channel region 115. The densified SiONC:H film can also serve as a passivation film 122 for protecting the device 100. According to one embodiment of the present invention, the densified SiONC:H film 122 has a tensile stress equal to or greater than about 1.5 GPa. According to another embodiment of the present invention, the SiONC:H film 122 has a tensile stress greater than about 1.5 GPa but less than about 3.0 GPa. Variations in the tensile stress in the densified SiONC:H film can be +/−0.1 GPa.

Figure 2:
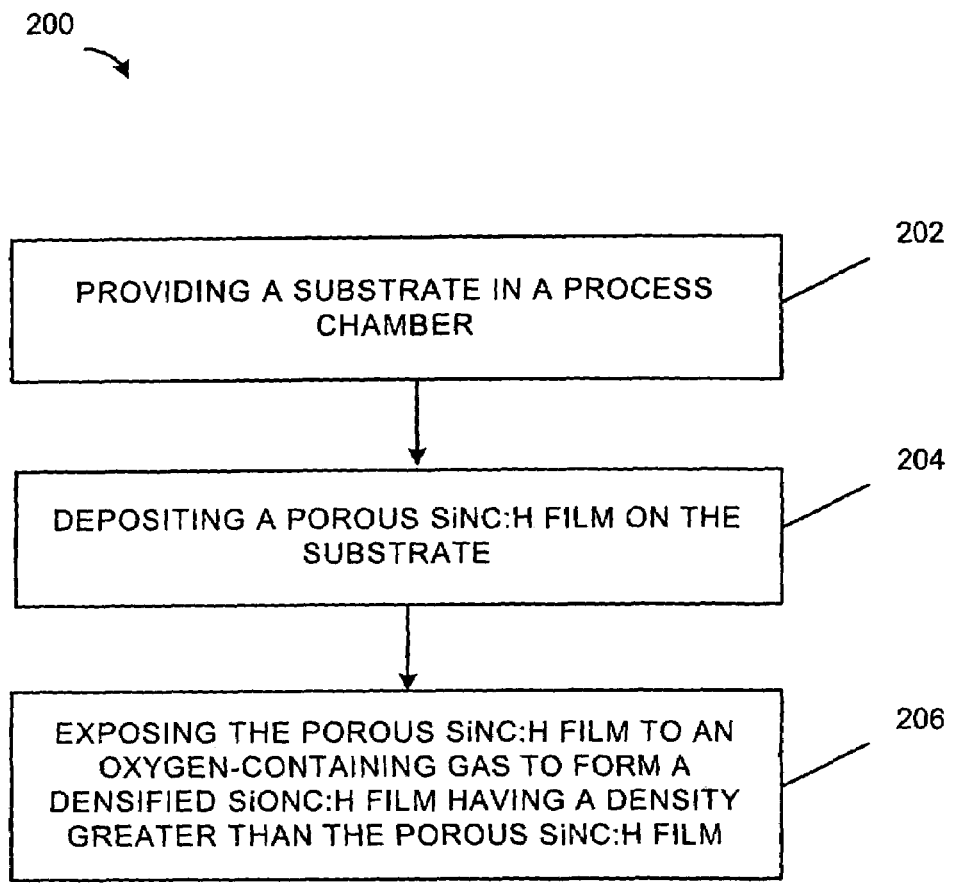
FIG. 2 is a process flow diagram according to an embodiment of the present invention for forming a silicon oxynitride film with tensile stress.
Figure 3A:
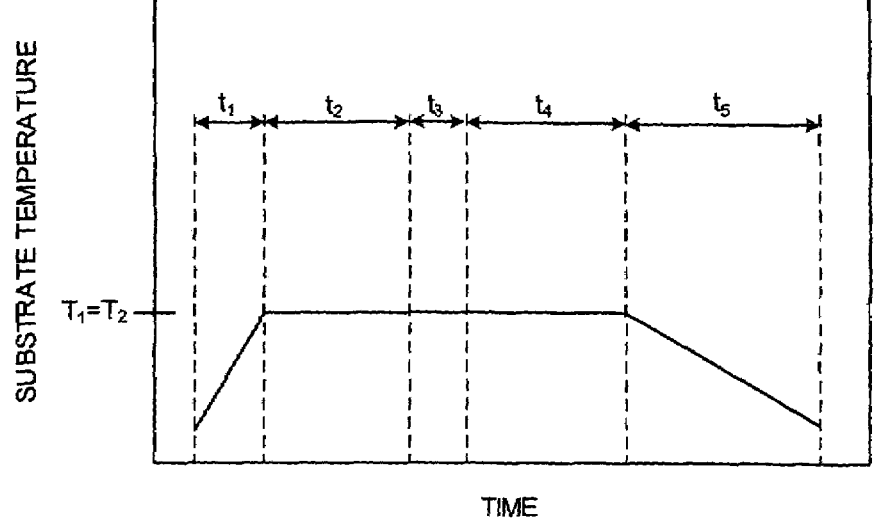
FIGS. 3A-3C are schematics according to various embodiments of the present invention showing variations in substrate temperature as a function of processing time for formation of a silicon oxynitride film with high tensile stress.
Figure 3B:
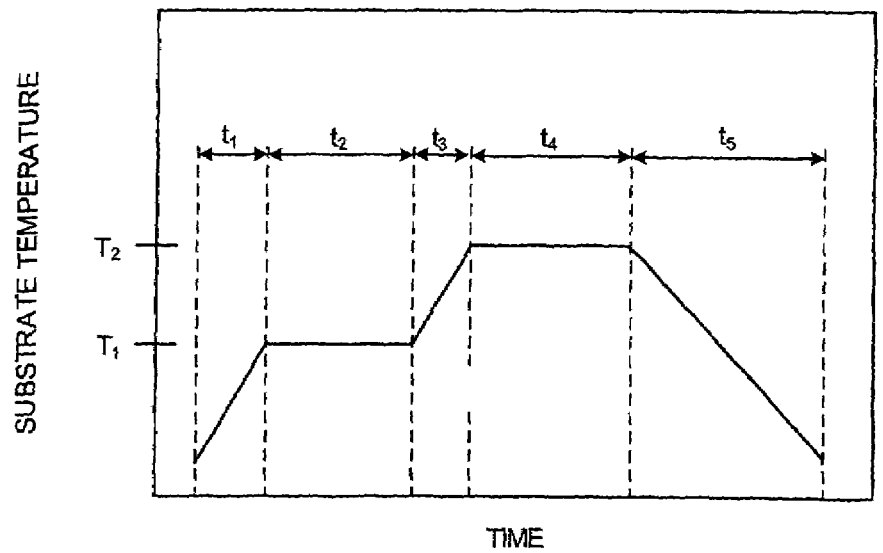
Figure 3C:
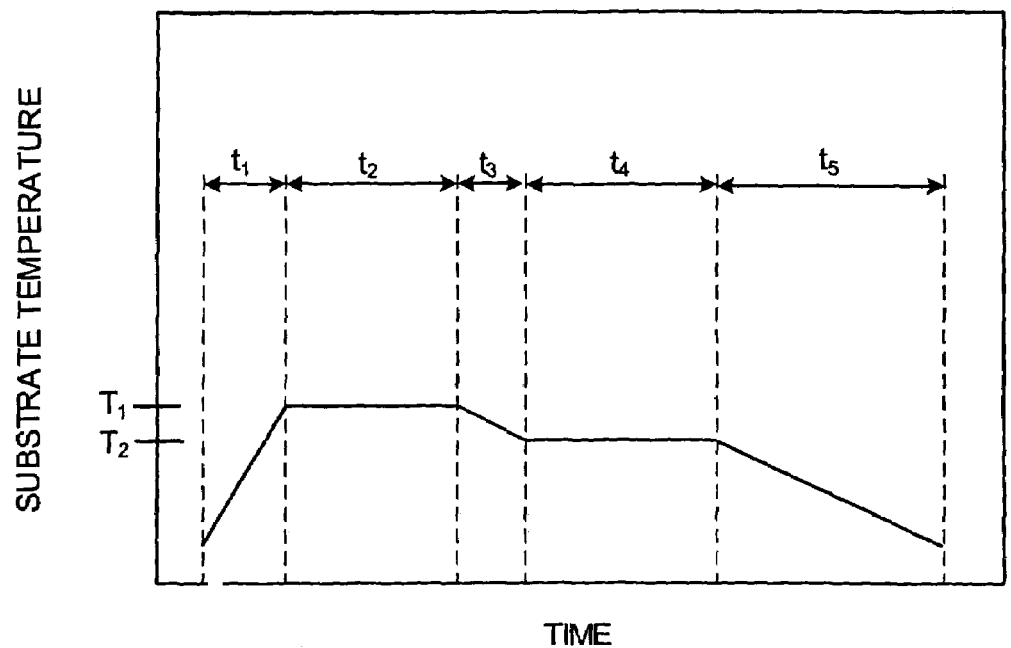

FIG. 2 is a process flow diagram, according to one embodiment of the present invention, for forming a silicon oxynitride film having tensile stress. FIGS. 3A-3C illustrate variations in substrate temperature as a function of processing time for a SiNC:H film deposition and illustrate the subsequent formation of a densified SiONC:H film having tensile stress.

Referring now to FIG. 2 and FIG. 3A, the process 200 includes, in step 202, a step of providing a substrate in a process chamber of a processing system. The processing system can, for example, be a batch processing system 1 depicted in FIG. 5. Alternatively, the processing system can be a single wafer processing system. The substrate can, for example, be a semiconductor substrate, such as a silicon substrate, a silicon germanium substrate, a germanium substrate, a glass substrate, a LCD substrate, or a compound semiconductor substrate such as for example GaAs. The substrate can include numerous active devices and/or isolation regions. Furthermore, the substrate can include vias or trenches or combinations thereof. According to one embodiment of the present invention, the substrate can include a gate stack, such as the gate stack 117 and 118 depicted in FIG. 1.

After providing the substrate in the process chamber in step 202, the substrate is heated to a first substrate temperature T$_1$ during time period t$_1$, as shown in FIG. 3A. The first substrate temperature T$_1$ can be selected in consideration of the overall thermal budget and in consideration of practical deposition rates of a SiNC:H film with desired properties, including porosity, elemental composition, density, etc. According to an embodiment of the present invention, the first substrate temperature T$_1$ can be between about 500° C. and about 800° C. Variations in temperatures used for deposition of the SiNC:H film can be less than +/−20° C. Alternately, the first substrate temperature T$_1$ can be between about 525° C. and about 575° C., for example 550° C. As illustrated in FIG. 3A, the time period t$_1$ can be a transition step and can for example have a duration between about 2 min and about 15 min.

In step 204, during time period t$_2$, a porous SiNC:H film is deposited on the substrate in a LPCVD process. According to an embodiment of the present invention, the SiNC:H film can be deposited by exposing the substrate to a process gas containing an organosilane gas and a nitrogen-containing gas. According to an embodiment of the present invention, the organosilane gas can be for example the above-noted BTBAS gas and the nitrogen-containing gas can be for example NH$_3$. The process gas can include BTBAS and NH$_3$ set to a BTBAS:NH$_3$ ratio greater than 1:2 (0.5:1). In another embodiment of the present invention, the BTBAS:NH$_3$ ratio can be between about 2:1 and about 8:1. Variations in the BTBAS:NH$_3$ ratio can be +/−5%. The above-noted BTBAS:NH$_3$ ratios are only exemplary, and other BTBAS:NH$_3$ ratios may be utilized in the present invention. Although the ratios given above are preferred due desirability of depositing a silicon nitride film that is porous and suitable for subsequent reactive densification, in general, any ratio of an organosilane gas and a nitrogen-containing gas that yields deposition of a porous SiNC:H film may be utilized in the present invention.

During step 204, the process chamber pressure may be maintained between about 0.05 Torr and about 200 Torr. This process chamber pressure range may be utilized for both batch and single wafer processing. For example, the process chamber pressure in a batch processing system or in a single wafer processing system may be maintained between about 0.3 Torr and about 10 Torr, for example about 0.5 Torr. Variations in the process chamber pressure during deposition of the SiNC:H films can be +/−5 5%. The exposure of the process gas can be performed under predetermined processing conditions for a time period that results in a SiNC:H film with a desired thickness. In one embodiment of the present invention, direct experimentation and/or by design of experiments (DOE) can refine process recipes for depositing a porous SiNC:H film.

While not required to practice the present invention, in one embodiment of the present invention, following deposition of a SiNC:H film on substrate, in step 206, the substrate is heated during time period $t_3$ from the first substrate temperature $T_1$ to a second substrate temperature $T_2$ greater than the first substrate temperature $T_1$. According to an embodiment of the present invention, the second substrate temperature $T_2$ can be between about 500° C. and about 800° C. Alternately, the second substrate temperature $T_1$ can be between about 525° C. and about 575° C. In one example, $T_1$ and $T_2$ can be about 550° C. Variations in the temperatures used during deposition of the SiNC:H films can be +/−10° C. during the deposition step and +/−5° C. during the oxygen anneal.

The process chamber, in one embodiment of the present invention, may be evacuated prior to or during the time period $t_3$ to remove the process gas of the CVD step 204 from the process chamber. Time period $t_3$ is a transition step and may be variable in length depending on system design and processing temperature differences between the deposition step 204 at the first substrate temperature $T_1$ and the second substrate temperature $T_2$. According to the embodiment of the present invention depicted in FIG. 3A, $T_1$ is equal to $T_2$. The time period $t_3$ can, for example, be between about 5 min and about 45 min. This time period is not required in various embodiments of the present invention.

In step 206, the porous SiNC:H film is exposed to an oxygen-containing gas for a time period $t_4$ at the second substrate temperature $T_2$ to form a densified SiONC:H film having a density greater than the porous SiNC:H film. In one embodiment of the present invention, the resultant densified SiONC:H film has a tensile stress greater than about 1.5 GPa. According to an embodiment of the present invention, the oxygen-containing gas can be air. Alternately, in other embodiments, the oxygen-containing gas can include $O_2$, $H_2O$, or a combination thereof. In step 206, exposure of the porous SiNC:H film to the oxygen-containing gas oxidizes and densifies the film, thereby increasing the tensile stress in the resultant film.

The processing parameters for step 206 can further include a process chamber pressure between about 1 Torr and about 1000 Torr during the step 204. Variations in the process chamber pressure used during oxidation of the SiNC:H film can be +/−5%. Substrate exposure to oxidizing process gases can be performed under predetermined processing conditions for a time period that results in SiONC:H films having desired tensile stress levels.

According to an embodiment of the present invention, the oxidation step 206 may be performed in the absence of a plasma. This permits integration of a tensile stressed SiONC:H film close to the channel region of a gate stack without potential substrate damage and/or charging effects from a plasma. In another embodiment of the present invention, a tensile stressed SiONC:H film can be integrated with or as the spacer 121 shown in FIG. 1.

Figure 5:
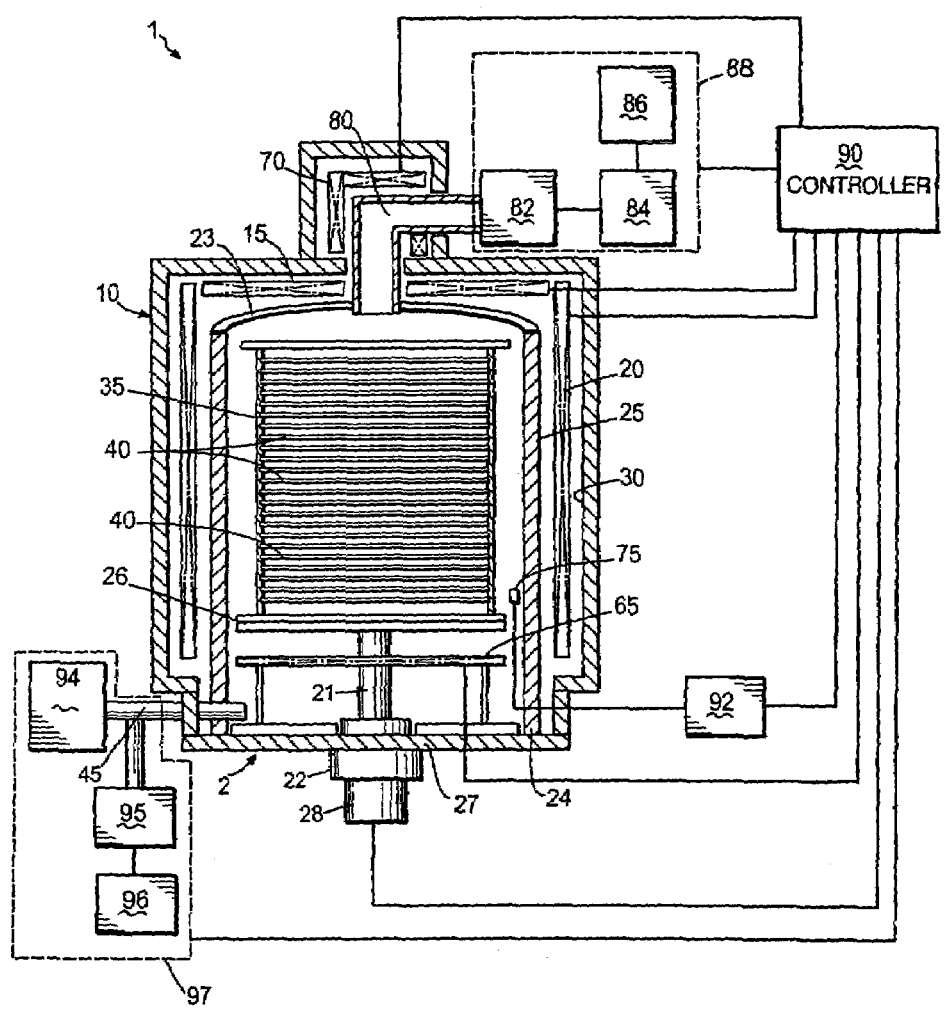
FIG. 5 is a schematic diagram of a batch processing system according to an embodiment of the present invention.

According to another embodiment of the present invention, the oxidation step 206 may be performed using a remote plasma source, where the substrate including the SiNC:H film is not placed in direct contact with the plasma but rather is placed down-stream of the plasma discharge. An exemplary batch processing system including a remote plasma source is depicted in FIG. 5.

When a SiONC:H film having a desired tensile stress has been formed on the substrate in step 206, in one embodiment of the present invention, exposure of the oxygen-containing gas is stopped, the substrate is allowed to cool down during time period $t_5$, and the substrate is subsequently removed from the process chamber. After removing the substrate from the process chamber, the tensile stress of the resultant densified SiONC:H film can be measured. Like time periods $t_1$ and $t_3$, the time period $t_5$ is a transition step and may be variable in length. Time period $t_5$ can, for example, be between about 2 min and about 15 min, but this is not required in embodiments of the invention.

Although not shown in FIG. 2, purging steps may be performed in between the steps of the process 200. For example, the process chamber may be purged during time period $t_3$ between the deposition step 204 and the exposure step 206 to remove the deposition gas from the process chamber and to keep a substrate surface clean. The purge gas can for example include $H_2$, an inert gas such as $N_2$, or a noble gas. Furthermore, one or more of the purge steps may be replaced or complemented with pump down steps where no purge gas is flowed.

Each of the steps or stages in the process flow of FIG. 2 may encompass one or more separate steps and/or operations. Accordingly, the recitation of only 3 steps in 202, 204, 206 should not be understood as limiting the method of the present invention solely to three steps or stages. Moreover, each representative step or stage 202, 204, 206 should not be understood as being limited to a single process.

According to one embodiment of the present invention, steps 204 and 206 can be repeated as many times as required to form a SiONC:H film of a requisite thickness. For example, steps 204 and 206 may be employed once to provide a first SiONC:H film having a thickness between about 5 nm and about 50 nm. Steps 204 and 206 can then be repeated to form a second SiONC:H film on the first SiONC:H film. By repeating steps 204 and 206, a SiONC:H film can be built to any desired thickness, e.g., about 10 nm to about 1000 nm. Variations in the thickness of the resultant SiONC:H film can be ±5%.

FIG. 3B illustrates changes in substrate temperature as a function of processing time for SiNC:H film deposition and for the subsequent formation of a densified SiONC:H film. According to the embodiment depicted in FIG. 3B, the second substrate temperature $T_2$ is greater than the first substrate temperature $T_1$. In FIG. 3B, the transition time period $t_3$ may longer than the transition time period $t_3$ in FIG. 3A, since the substrate temperature is increased between steps 204 and 206. For example, $T_1$ can be about 500° C. and $T_2$ can be about 550° C. In another example, $T_1$ can be about 550° C. and $T_2$ can be about 600° C. Variations in the substrate temperature during the temperatures for processing the SiNC:H and resultant SiONC:H films can be +/−10° C. during the deposition step and +/−5° C. during the oxygen anneal.

FIG. 3C illustrates changes in substrate temperature as a function of processing time for SiNC:H film deposition and for the subsequent formation of a densified SiONC:H film. According to the embodiment depicted in FIG. 3C, the second substrate temperature $T_2$ is lower than the first substrate temperature $T_1$. In FIG. 3C, the transition time period $t_3$ may be longer than the transition time period $t_3$ in FIG. 3A, since the substrate temperature is decreased between steps 204 and 206. For example, $T_1$ can be about 600° C. and $T_2$ can be about 550° C. In another example, $T_1$ can be about 550° C. and $T_2$ can be about 500° C.

ILLUSTRATIVE EXAMPLES

In one example of the densified films of the present invention, SiNC:H films were deposited in a LPCVD process by exposing substrates to BTBAS and $NH_3$. The deposition pressure for this example was 0.5 Torr. The BTBAS:$NH_3$ gas flow ratios were 4:1 and 8:1. For the 4:1 flow ratio, the BTBAS flow was 100 sccm and the $NH_3$ flow was 25 sccm. For the 8:1 flow ratio, the BTBAS flow was 100 sccm and the $NH_3$ flow was 12.5 sccm. The substrates were maintained at a temperature of 550° C. The deposited SiNC:H films exhibited moderate compressive stress ranging from about 570 MPa to about 760 MPa. The deposited SiNC:H films were then exposed to air at or near the SiNC:H deposition temperature of 550° C. to form densified SiONC:H films. While not limited to the following interpretation, lowering of the film refractive index and film thickness upon air exposure indicates that oxygen diffused into the SiNC:H films and subsequently interacted with dangling (unsaturated) or weak chemical bonds within the SiNC:H film, resulting in oxygen incorporation which acted to reduce microvoids, and densify the as-deposited SiNC:H network structure. The densification and strengthening of the as-deposited SiNC:H network through air exposure at 550° C. resulted in densified SiONC:H films having tensile stress levels ranging from about 1.5 GPa to about 2.3 GPa.

In another example, about 25 nm thick SiNC:H films were deposited in a LPCVD process by exposing Si substrates containing a $SiO_2$ layer to BTBAS and $NH_3$. The deposition pressure for this example was 0.5 Torr. The BTBAS:$NH_3$ gas flow ratios were 1:2 (i.e., a relatively high $NH_3$ flow) and 4:1 (i.e., a relatively high BTBAS flow). The high BTBAS flow yielded a low quality SiNC:H film (film B) with high levels of micro-voids and impurities, such as carbon. The high $NH_3$ flow yielded SiNC:H films (film A) with lower carbon incorporation, indicating less trapped deposition byproducts and a greater film density. Deposition of the SiNC:H films and subsequent exposure of the SiNC:H films to air to form SiONC:H films were performed at substrate temperatures of 550° C.

Figure 4A:
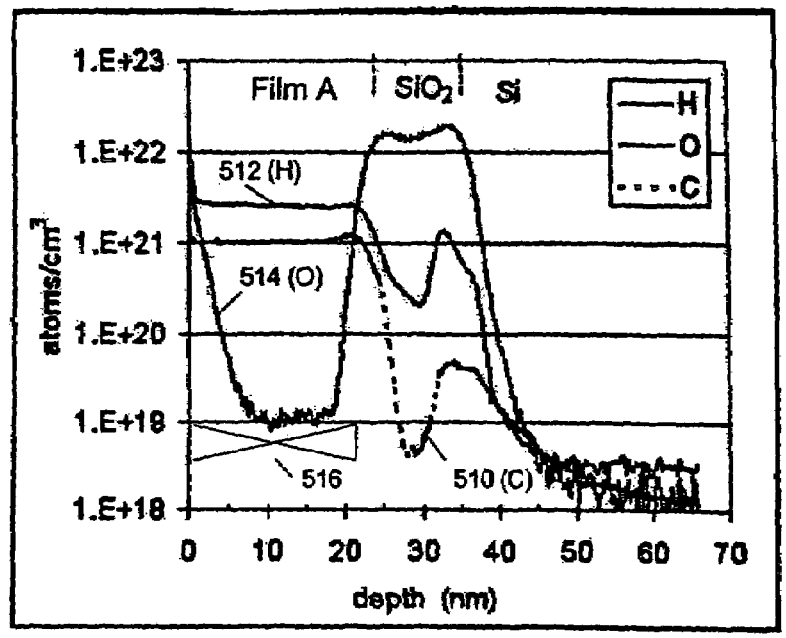
FIGS. 4A and 4B are schematics showing SIMS depth profiles for silicon oxynitride films.
Figure 4B:
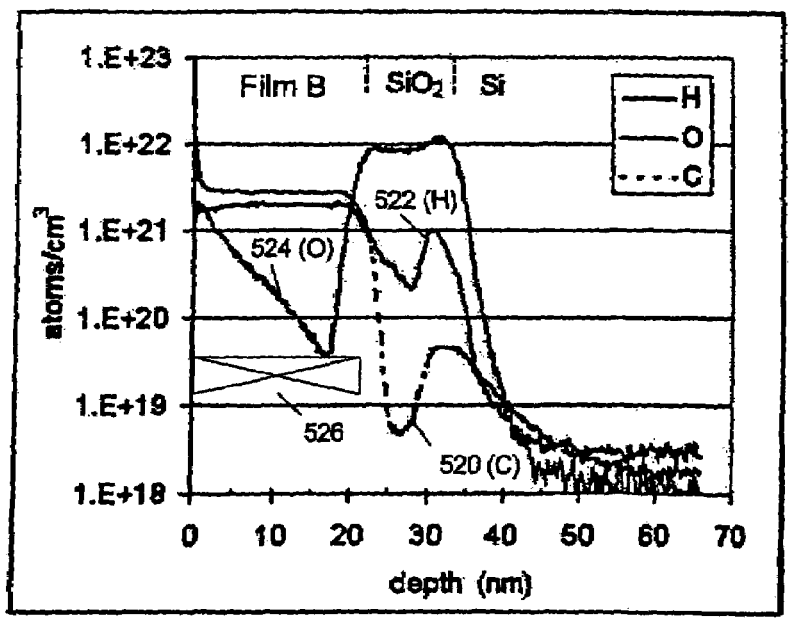

Secondary Ion Mass Spectroscopy (SIMS) depth profiles of the resultant SiONC:H films are shown in FIGS. 4A (i.e., for film A) and 4B (i.e., for film B). FIG. 4A shows C signal 510, H signal 512, and O signal 514 for film A. FIG. 4B shows C signal 520, H signal 522, and O signal 524 for film B. Film A had a tensile stress of 1.2 GPa, whereas film B had a greater tensile stress of 2.3 GPa. Comparison of the oxygen signals 514 in FIG. 4A and 524 in FIG. 4B shows elevated oxygen level and an oxygen concentration gradient profile within the porous film B (i.e., see region 516), whereas the less porous film A shows less oxygen incorporation (i.e., see region 526) during the air exposure.

The formation of densified SiONC:H films from porous SiNC:H films was found by the present inventors to be affected by diffusion of oxygen within the porous SiONC:H films. Furthermore, efficient incorporation of oxygen into the SiNC:H film deposited from BTBAS and $NH_3$ was found by the present inventors to be enhanced about a 50 nm region near the SiONC:H film surface. However, according to one embodiment of the present invention, highly stressed SiONC:H films with thicknesses greater than about 50 nm can be formed through multiple deposition/oxidation cycles.

Various embodiments of the present invention can be efficiently carried out and integrated with processing systems currently utilized for manufacturing of integrated circuits (ICs) and do not necessarily require additional expensive hardware such as is used for forming tensile stressed silicon nitride films by a UV post-deposition treatment.

FIG. 5 shows a simplified block diagram of a batch processing system for processing a substrate according to an embodiment of the present invention, including the aforementioned remote plasma source. As shown in FIG. 5, the batch processing system 1 includes a process chamber 10 and a process tube 25 that has an upper end 23 connected to an exhaust pipe 80, and a lower end 24 hermetically joined to a lid 27 of cylindrical manifold 2. The exhaust pipe 80 discharges gases from the process tube 25 to a vacuum pumping system 88 to maintain a pre-determined atmospheric or below atmospheric pressure in the processing system 1. A substrate holder 35 for holding a plurality of substrates (wafers) 40 in a tier-like manner (in respective horizontal planes at vertical intervals) is placed in the process tube 25. The substrate holder 35 resides on a turntable 26 that is mounted on a rotating shaft 21 penetrating the lid 27 and driven by a motor 28. The turntable 26 can be rotated during processing to improve overall film uniformity. Alternately, the turntable can be stationary during processing. The lid 27 is mounted on an elevator 22 for transferring the substrate holder 35 in and out of the process tube 25. When the lid 27 is positioned at its uppermost position, the lid 27 is adapted to close the open end of the manifold 2.

As shown in FIG. 5, a gas delivery system 97 is configured for introducing gases into the process chamber 10. A plurality of gas supply lines can be arranged around the manifold 2 to supply a plurality of gases into the process tube 25 through the gas supply lines. In FIG. 5, only one gas supply line 45 among the plurality of gas supply lines is shown. The gas supply line 45 shown, is connected to a first gas source 94. In general, the first gas source 94 can supply gases for processing the substrates 40, including (1) organosilane gases and nitrogen-containing gases for depositing porous SiNC:H films onto the substrates 40 and (2) an oxygen-containing gas such as air, $O_2$, $H_2O$, or $O_3$ for oxidizing the porous SiNC:H films.

In addition, or in the alternative, one or more of the gases can be supplied from the (remote) plasma source 95 that is operatively coupled to a second gas source 96 and to the process chamber 10 by the gas supply line 45. The plasma-excited gas is introduced into the process tube 25 by the gas supply line 45. The plasma source 95 can for example be a microwave plasma source, a radio frequency (RF) plasma source, or a plasma source powered by light radiation. In the case of a microwave plasma source, the microwave power can be between about 500 Watts (W) and about 5,000 W. The microwave frequency can, for example, be 2.45 GHz or 8.3 GHz. In one embodiment of the present invention, the remote plasma source can be a Downstream Plasma Source Type AX7610, manufactured by MKS Instruments, Wilmington, Mass., USA.

A cylindrical heat reflector 30 can be disposed so as to cover the reaction tube 25. The heat reflector 30 preferably has a mirror-finished inner surface to suppress dissipation of radiation heat radiated by main heater 20, bottom heater 65, top heater 15, and exhaust pipe heater 70. A helical cooling water passage (not shown) can be formed in the wall of the process chamber 10 as a cooling medium passage. The heaters 20, 65, and 15 can for example maintain the temperature of the substrates 40 between about 20° C. and about 900° C.

The vacuum pumping system 88 includes a vacuum pump 86, a trap 84, and automatic pressure controller (APC) 82. The vacuum pump 86 can, for example, include a dry vacuum pump capable of a pumping speed up to 20,000 liters per second (and greater). During processing, gases can be introduced into the process chamber 10 via the gas supply line 45 of the gas delivery system 97 and the process pressure can be adjusted by the APC 82. The trap 84 can collect unreacted precursor material and by-products as these products flow from the process chamber 10.

The process monitoring system 92 can include a sensor 75 capable of real-time process monitoring and can, for example, include a mass spectrometer (MS), a FTIR spectrometer, or a particle counter. A controller 90 can include a microprocessor, a memory, and a digital I/O port capable of generating control voltages sufficient to communicate and activate inputs to the processing system 1 as well as monitor outputs from the processing system 1. Moreover, the controller 90 can be coupled to and can exchange information with gas delivery system 97, motor 28, process monitoring system 92, heaters 20, 15, 65, and 70, and vacuum pumping system 88. The controller 90 may be implemented as a DELL PRECISION WORKSTATION 610™. The controller 90 may also be implemented as a general purpose computer, processor, digital signal processor, etc., which causes a substrate processing apparatus to perform a portion or all of the processing steps of the invention in response to the controller 90 executing one or more sequences of one or more instructions contained in a computer readable medium. The computer readable medium or memory for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

The controller 90 may be locally located relative to the processing system 1, or may be remotely located relative to the processing system 1 via an internet or intranet. Thus, the controller 90 can exchange data with the processing system 1 using at least one of a direct connection, an intranet, and the internet. The controller 90 may be coupled to an intranet at a customer site (i.e., a device maker, etc.), or coupled to an intranet at a vendor site (i.e., an equipment manufacturer). Furthermore, another computer (i.e., controller, server, etc.) can access controller 90 to exchange data via at least one of a direct connection, an intranet, and the internet.

It is to be understood that the batch processing system 1 depicted in FIG. 5 is shown for exemplary purposes only, as many variations of the specific hardware can be used to practice the present invention. The processing system 1 in FIG. 5 can for example process substrates of any size, such as 200 mm substrates, 300 mm substrates, or even larger substrates. Furthermore, the processing system 1 can simultaneously process up to about 200 substrates, or more. Alternately, the processing system 1 can simultaneously process up to about 25 substrates.

Alternately, a single wafer deposition system may be used to form highly stressed silicon oxynitride films according to an embodiment of the invention. One example of a single wafer deposition system is described in U.S. patent application Ser. No. 11/711,721, titled "A METHOD FOR FORMING A THIN COMPLETE HIGH-PERMITTIVITY DIELECTRIC LAYER", filed on Sep. 30, 2004, the entire contents of which are hereby incorporated by reference.

Numerous modifications and variations on the present invention are possible in light of the above teachings. It is, therefore, to be understood that within the scope of the accompanying claims, the invention may be practiced otherwise than as specifically described herein.

The invention claimed is:

1. A method of forming a silicon oxynitride film, comprising:
    depositing a porous SiNC:H film on a substrate; and
    exposing the porous SiNC:H film to an oxygen-containing gas to form a densified SiONC:H film having a density greater than the porous SiNC:H film.

2. The method according to claim 1, wherein the exposing the porous SiNC:H film to an oxygen-containing gas comprises: producing a densified SiONC:H film having a tensile stress equal to or greater than about 1.5 GPa.

3. The method according to claim 1, wherein the depositing comprises: exposing the substrate to a process gas including an organosilane gas and a nitrogen-containing gas.

4. The method according to claim 1, wherein the depositing comprises: exposing the substrate to a process gas including BTBAS bis(tertiary-butylaminosilane) and $NH_3$.

5. The method according to claim 4, wherein the exposing comprises: supplying the process gas with a BTBAS: $NH_3$ ratio greater than 0.5:1.

6. The method according to claim 4, wherein the exposing comprises: supplying the process gas with a BTBAS: $NH_3$ ratio between about 2:1 and about 8:1.

7. The method according to claim 4, wherein the exposing further comprises: maintaining the substrate at a temperature between about 500° C. and about 800° C.

8. The method according to claim 4, wherein the exposing further comprises: maintaining the substrate at a temperature between about 525° C. and about 575° C.

9. The method according to claim 1, wherein the depositing further comprises: maintaining a process chamber pressure between about 0.05 Torr and about 200 Torr.

10. The method according to claim 1, wherein the depositing further comprises: maintaining a process chamber pressure between about 0.3 Torr and about 10 Torr.

11. The method according to claim 1, wherein the depositing comprises: depositing the SiONC:H film to a thickness between about 5 nm and about 50 nm.

12. The method according to claim 1, wherein the exposing the porous SiNC:H film to an oxygen-containing gas comprises: exposing the porous SiNC:H film to air.

13. The method according to claim 1, wherein the exposing the porous SiNC:H film to an oxygen-containing gas comprises: exposing the porous SiNC:H film to at least one of $O_2$, $H_2O$, $O_3$, or a combination thereof.

14. The method according to claim 13, wherein the exposing the porous SiNC:H film to an oxygen-containing gas comprises: maintaining the process chamber at a pressure between about 1 Torr and about 1000 Torr.

15. The method according to claim 1, further comprising: repeating the depositing a porous SiNC:H film and exposing the porous SiNC:H film to an oxygen-containing gas until the SiONC:H film has a predetermined thickness.

16. The method according to claim 15, wherein the repeating the depositing a porous SiNC:H film comprises: continuing the repeating until the SiONC:H film has a thickness of between about 10 nm and about 1000 nm.

17. The method according to claim 1, wherein the depositing a porous SiNC:H film on a substrate comprises: depositing on a device having at least one doped region and a gate stack formed on the substrate.

18. The method according to claim 1, wherein the depositing is performed at approximately the same temperature as the exposing, at a lower temperature than the exposing, or at a higher temperature than the exposing.

19. The method according to claim 1, wherein the exposing the porous SiNC:H film to an oxygen-containing gas comprises: producing a densified SiONC:H film having a tensile stress equal to or greater than about 1.5 GPa but less than about 3.0 GPa.

* * * * *